United States Patent
Boudreaux et al.

(10) Patent No.: US 6,958,445 B1
(45) Date of Patent: Oct. 25, 2005

(54) ELECTROMAGNETIC INTERFERENCE SHIELD FOR ELECTRONIC DEVICES ON A CIRCUIT BOARD

(75) Inventors: Brent A. Boudreaux, Highland Village, TX (US); Richard A. Schumacher, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 9 days.

(21) Appl. No.: 11/014,292

(22) Filed: Dec. 16, 2004

(51) Int. Cl.[7] .............................................. H05K 9/00
(52) U.S. Cl. ................ 174/35 GC; 361/816; 174/35 R
(58) Field of Search ......................... 174/35 R, 35 GC; 361/816, 818, 800

(56) References Cited

U.S. PATENT DOCUMENTS

| | | | |
|---|---|---|---|
| 5,354,951 A | 10/1994 | Lange, Sr. et al. | |
| 5,644,101 A * | 7/1997 | Elliott | 174/35 R |
| 5,880,930 A | 3/1999 | Wheaton | |
| 6,566,973 B2 | 5/2003 | Schumacher | |
| 6,743,975 B2 | 6/2004 | Kolb | |
| 2001/0033478 A1 * | 10/2001 | Ortiz et al. | 361/818 |
| 2002/0129951 A1 | 9/2002 | Babb et al. | |
| 2004/0055770 A1 | 3/2004 | Babb et al. | |
| 2005/0078468 A1 * | 4/2005 | DiPoala | 361/818 |

* cited by examiner

Primary Examiner—Hung V. Ngo (57) ABSTRACT

A system composes a circuit board, electronic devices mounted on a first surface of the circuit board, and an electromagnetic interference (EMI) shield removably mounted to the first surface of the circuit board. The EMI shield defines a chamber to contain the electronic devices. An electrically conductive member is mounted to a second surface of the circuit board. At least an electrically conductive structure extends from the first surface to the second surface of the circuit board to electrically connect the EMI shield to the electrically conductive member.

35 Claims, 4 Drawing Sheets

ELECTROMAGNETIC INTERFERENCE SHIELD FOR ELECTRONIC DEVICES ON A CIRCUIT BOARD

BACKGROUND

With ever increasing operational speeds of electronic devices in electronic systems, such as computer systems, relatively large amounts of electromagnetic (EM) emissions are generated by the electronic devices during operation. Such EM emissions cause electromagnetic interference (EMI) that may interfere with operations of other electronic systems. Consequently, government agencies have established regulations to reduce EM emissions from electronic systems.

A technique that is widely used to reduce EMI is the use of EMI shields. Often, an EMI shield is in the form of a shielded enclosure provided by the outside cabinet or housing of an electronic system. In other cases, EMI shields in the form of metal cages have been provided within system enclosures to cover individual electronic devices for EMI suppression during operation of such individual electronic devices.

An electronic system typically includes one or more circuit boards on which electronic devices are mounted. The use of metal cages for individual electronic devices often takes up valuable real estate on the surface of a circuit board on which electronic devices are mounted. Decreased availability of the surface area of the circuit board for mounting electronic devices may mean that larger circuit boards have to be used to mount the same number of electronic devices, which may lead to increased manufacturing costs.

Another form of EMI shielding that has been employed includes EMI coating applied onto electronic devices on a surface of a circuit board. The EMI coating conforms to the shape of the electronic devices. However, an issue associated with the EMI coating is the difficulty associated with removing the coating in case access is desired of electronic devices for performing maintenance or upgrades. To remove any part of the EMI coating, a part of the EMI coating has to be cut away, which means that the EMI coating would be damaged.

DETAILED DESCRIPTION

Figure 1:
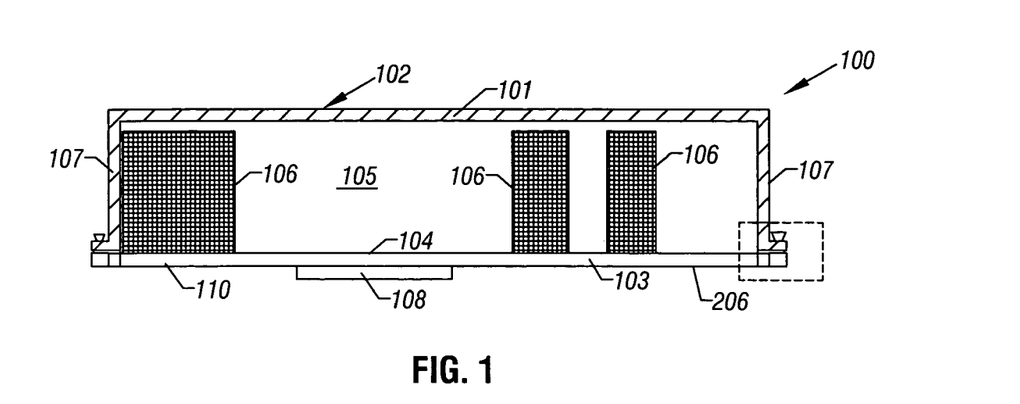
FIG. 1 is a sectional view of an assembly including an electromagnetic interference (EMI) shield mounted on a surface of a circuit board to cover electronic devices, in accordance with an embodiment.

FIG. 1 illustrates an assembly 100 that includes a circuit board 103 having a first surface 104 on which are mounted electronic devices 106. The assembly 100 is part of an electronic system, such as a computer system. Examples of the electronic devices 106 include processors, memory devices, input/output (I/O) controllers, video controllers, network interface controllers, peripheral devices, and so forth.

During operation, the electronic devices 106 generate electromagnetic (EM) emissions that may cause electromagnetic interference (EMI). To reduce EMI, an EMI shield 102 is mounted onto the first surface 104 of the circuit board 103. The EMI shield 102 is formed at least in part of an electrically conductive material, such as metal or an electrically conductive non-metal material. In one embodiment, the EMI shield 102 is a cage defining an inner chamber 105 in which electronic devices 106 can fit. To provide a larger surface area of the first surface 104 of the circuit board 103 for mounting electronic devices 106, the side walls 107 of the EMI shield 102 are placed at the perimeter of the circuit board 103 (as depicted in FIG. 1). The side walls 107 of the EMI shield 102 are placed generally at the edges (defining the perimeter) of the circuit board 103.

The EMI shield 102 has the side walls 107 and a top cover 101 to provide a generally cup-shaped structure that defines the chamber 105. In FIG. 1, the generally cup-shaped structure has right angles between the side walls 107 and top cover 101. In alternative configurations, a more curved transition can be provided between the top cover 101 and the side walls 107.

Figure 2:
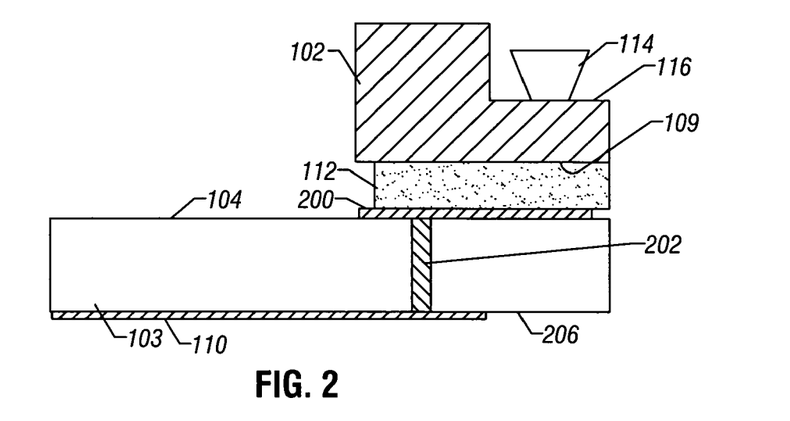
FIG. 2 illustrates in greater detail the manner in which the EMI shield of FIG. 1 is mounted to the circuit board.

The mounting arrangement of the EMI shield 102 to the circuit board 103 is depicted in greater detail in FIG. 2, which illustrates details within the dashed box of FIG. 1. A lower contact edge 109 of the EMI shield 102 is contacted to an EMI gasket 112 that is in turn contacted to an electrically conductive surface pad 200. The EMI gasket 112, which is formed of a resilient, electrically conductive material, enables superior electrical contact between the contact edge 109 of the EMI shield 102 and the surface pad 200. The surface pad 200, containing an electrically conductive material, can be formed by depositing a layer of electrically conductive material onto the first surface 104 of the circuit board 103.

As further depicted in FIG. 2, a through via 202 extends inside a through hole in the circuit board 103 from the first surface 104 to a second surface 206 of the circuit board 103. The first and second surfaces 104 and 206 of the circuit board 103 are on opposite sides of the circuit board 103. The through via 202 is formed of an electrically conductive material to enable electrical connection between the surface pad 200 (on the first surface 104 of the circuit board 103) and an electrically conductive member 110 mounted on the second surface 206 of the circuit board 103. In one embodiment, the electrically conductive member 110 is a plate that covers an area of the second surface 206 of the circuit board 103 that is sufficient to provide adequate EMI shielding for the particular application of the circuit board (e.g., operating frequencies of electronic devices, placement and location of electronic devices, and other factors). The electrically conductive plate 110, in cooperation with the through via 202, surface pad 200, EMI gasket 112, and EMI shield 102 provide a complete enclosure to suppress EM emissions from inside the chamber 105 (FIG. 1) to a region outside the EMI shield 102. Also, the EMI shielding can also suppresses external EMI emissions from entering the enclosure.

As further depicted in FIG. 1, a connector 108 is provided on the second surface 206 of the circuit board 103 to electrically connect the assembly 100 to some other part of the system. The connector 108 has signal pins and power voltage pins. The connector 108 is a shielded connector that includes a shield electrically connected to the electrically conductive plate 110 to suppress EM emissions from the chamber 105 of the assembly 100 through or around the connector 108.

The EMI shield 102 is removably mounted to the first surface 104 of the circuit board 103 by attachment mechanisms 114 (FIG. 2). Using the attachment mechanisms 114, the EMI shield 102 can be removed as a unit from the circuit board 103 and subsequently re-mounted to the circuit board 103. Being able to remove the EMI shield 102 as a unit means that the EMI shield can be removed in its entirety without destroying or cutting any part of the EMI shield. Examples of the attachment mechanisms 114 include screws, nut and bolt mechanisms, rivets, latches, fasteners, or other types of attachment mechanisms. The attachment mechanisms 114 attach a flange portion 116 of the EMI shield 102 (which flange portion 116 protrudes outwardly from the EMI shield 102), to the perimeter of the circuit board 103. In other embodiments, other techniques for removably mounting the EMI shield 102 to the circuit board 103 can be employed. For example, the EMI shield 102 can be permanently or semi-permanently attached to the circuit board 102 through a soldering operation or other bonding techniques.

By removably mounting the EMI shield 102 to the surface 104 of the circuit board, the EMI shield 102 can be easily and conveniently removed to enable access to the electronic devices 106 mounted to the circuit board 103. Thus, for example, to perform upgrades (such as upgrades of CPUs or memory devices) or maintenance, a user can remove the EMI shield 102, replace the selected electronic devices, and re-mount the same EMI shield 102 to the circuit board 103.

Figure 3:
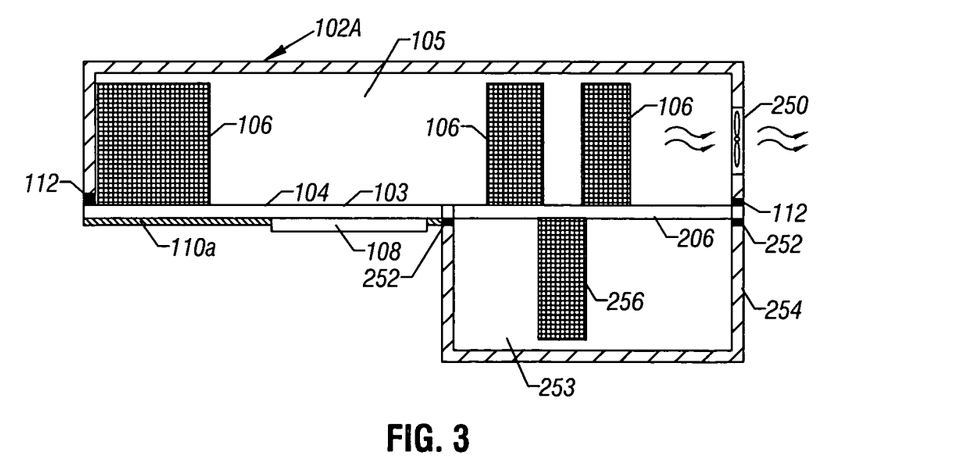
FIG. 3 is a sectional view of an assembly including EMI shields mounted to a circuit board, according to another embodiment.

FIG. 3 depicts another embodiment of an assembly that includes two EMI shields 102A and 254. The EMI shield 102A is substantially identical to the EMI shield 102 depicted in FIG. 1, except for the provision of an airflow generator 250 in the EMI shield 102A to generate airflow inside the chamber 105 of the EMI shield 102A. Although not depicted, the EMI shields 102A and 254 are attached by attachment mechanisms (similar to 114 of FIG. 1) to the circuit board 103 of FIG. 3.

The airflow generator 250 directs a flow of air from inside the chamber 105 to a location outside the EMI shield 102A. The air flow allows for cooling of the electronic devices 106 mounted inside the chamber 105 of the EMI shield 102A. An electrically conductive screen can be provided in the airflow generator 250 to provide EMI containment.

In the embodiment of FIG. 3, instead of an electrically conductive plate 110 (FIG. 1) that covers the second surface 206 of the circuit board 103, an electrically conductive plate 110A partially covers the second surface 206 of the circuit board 103. The rest of the second surface 206 of the circuit board 103 is covered by the EMI shield 254, which defines a chamber 253 within which one or more electronic devices 256 can be provided. The electronic device(s) 256 is (are) mounted to the second surface 206 of the circuit board 103.

A contact edge of the EMI shield 254 is contacted to an EMI gasket 252 to enhance electrical connection between the EMI shield 254 and electrically conductive structures, such as the electrically conductive plate 110A and an electrically conductive surface pad that is electrically connected by a through via (such as through via 202 depicted in FIG. 2) to a surface pad 200 on the other side 104 of the circuit board 103.

By employing the arrangement of FIG. 3, a greater surface area is made available for mounting electronic devices, while at the same time providing effective electronic shields that suppress EM emissions.

Figure 4:
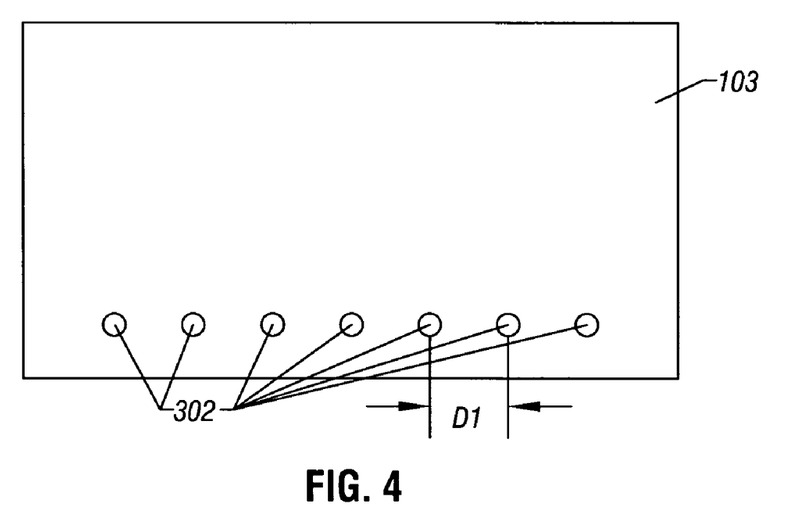
FIG. 4 is a top view of via holes formed in the circuit board to enable electrical connection between the EMI shield of FIG. 1 or FIG. 3 with an electrically conductive member on the other side of the circuit board.

FIG. 4 is a top view of the circuit board 103 in which through holes 302 are provided to receive respective through vias 202 (FIG. 2) to electrically connect an EMI shield (such as EMI shield 102 or 102A) to an electrically conductive structure (such as electrically conductive plate 110, in FIG. 2, or 110A or EMI shield 254, in FIG. 3) on the other side of the circuit board 103. For effective suppression of EM emissions, a spacing D1 is defined between center lines of adjacent through holes 302. The distance D1 between through holes 302 is selected based on the highest operating frequency expected of electronic devices mounted on the circuit board 103. A frequency is associated with a wavelength. Thus, the spacing D1 is selected to be sufficiently small compared to the shortest wavelength (associated with the highest operating frequency) to provide effective containment of EM emissions.

Figure 5:
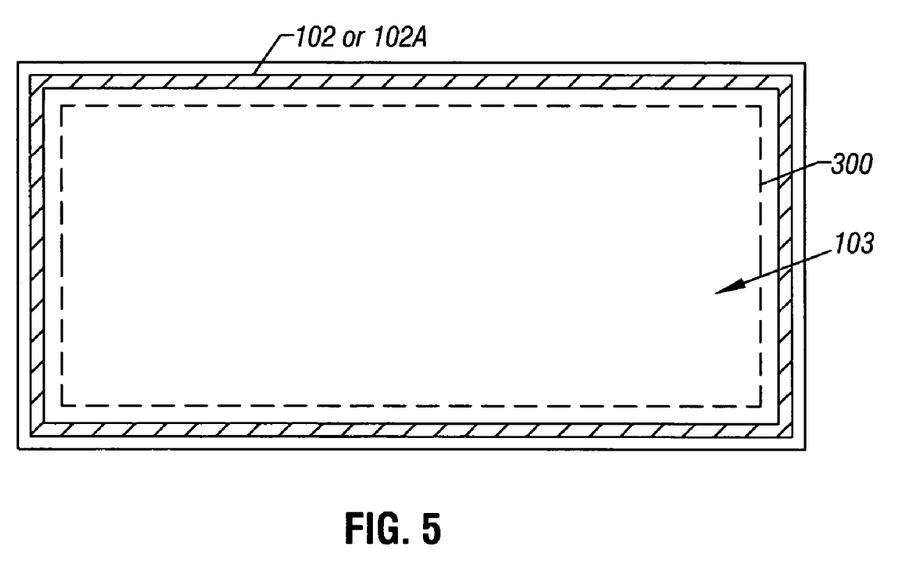
FIG. 5 is a top view of a circuit board to illustrate the surface area available for mounting electronic devices on the circuit board, according to an embodiment.

FIG. 5 is a top view illustrating an available surface area (represented by a rectangular region indicated by dashed line 300). By providing the side walls 107 (FIG. 1) of the EMI shield 102 (or 102A) close to the edges (defining the perimeter) of the circuit board 103, a larger surface area 300 is made available for mounting electronic devices. Consequently, a greater number of electronic devices and/or a greater density of electronic devices can be provided on the circuit board 103 while still achieving effective EM emission suppression using the EMI shield 102 or 102A. The side walls 107 of the EMI shield 102 (or 102A) are generally at the perimeter of the circuit board. A side wall of the EMI shield 102 is "generally" at the perimeter of a circuit board if the side wall is as close as possible to a corresponding side edge of the circuit board while still allowing space for any attachment mechanism for attaching the EMI shield to the circuit board.

Figure 6:
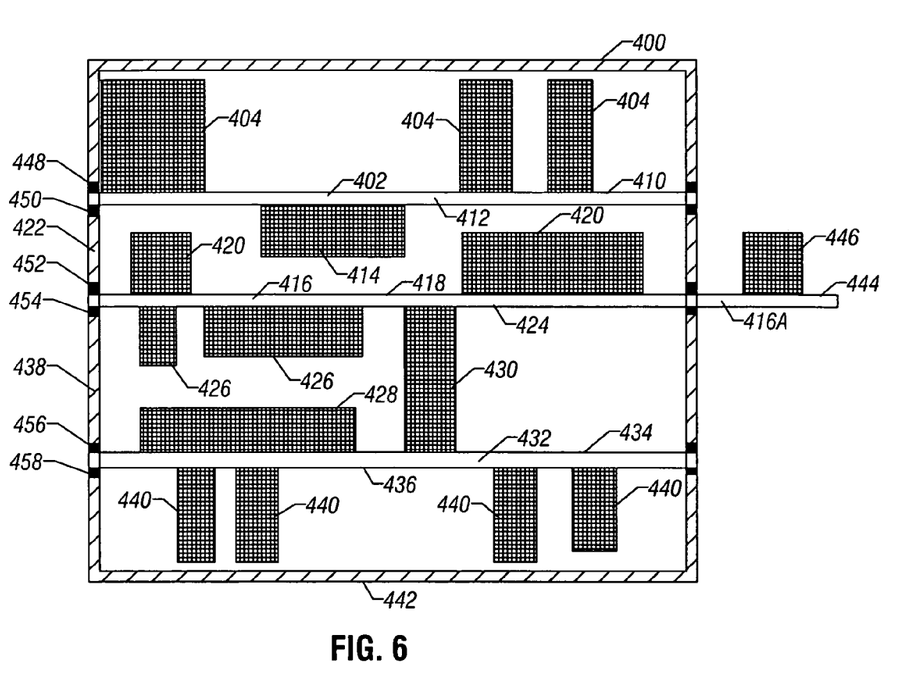
FIG. 6 is a sectional view of an assembly having plural circuit boards and multiple EMI shields to enclose electronic devices mounted on the plural circuit boards, according to another embodiment.

FIG. 6 depicts a different embodiment that includes multiple circuit boards 402, 416, and 432. Although three circuit boards are depicted in FIG. 6, it is contemplated that different embodiments can employ a smaller or larger number of circuit boards. Each circuit board has two surfaces on which electronic devices can be mounted. To contain EM emissions of such electronic devices mounted on the surfaces of the circuit boards, EMI shields 400, 422, 438, and 442 are provided. The EMI shields 400 and 442 are similarly shaped (generally cup-shaped) as the EMI shield 102 of FIG. 1. On the other hand, each of the EMI shields 422 and 438 has side walls but does not have either a top or bottom cover.

The circuit board 402 has a first surface 410 on which electronic devices 404 are mounted. The circuit board 402 also has a second surface 412, on the opposite side from the first surface 410, on which one or more electronic devices 414 can be mounted.

Similarly, electronic devices 420 are mounted on a first surface 418 of the circuit board 416, whereas electronic devices 426 and electronic device 430 are mounted on the second surface 424 of the circuit board 416. Similarly, electronic devices 428 and 430 are mounted on a first surface 434 of circuit board 432, while electronic devices 440 are mounted on the second surface 436 of the circuit board 432.

The EMI shield 400 is mounted onto the first surface 410 of the circuit board 402. A contact edge of the EMI shield 400 is electrically connected through an EMI gasket 448, electrically conductive structures (such as electrically conductive surface pads 502 and 506 and through via 500 depicted in FIG. 7), and an EMI gasket 450 to the EMI shield 422.

Figure 7:
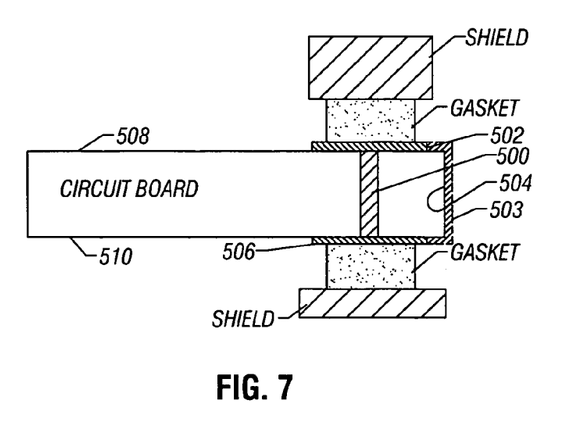
FIG. 7 illustrates in greater detail the manner in which EMI shields in the assembly of FIG. 6 are electrically connected.

As depicted in FIG. 7, the through via 500 extends through the circuit board 402. Alternatively, instead of using the through via 500, an electrically conductive layer 503 (formed on surfaces of the circuit board) can wrap around the side 504 of the circuit board to electrically connect the surface pads 502 and 506 on opposite surfaces 508 and 510 of the circuit board. The layer 503 can be formed on surfaces of the circuit board using circuit board processing techniques. The layer 503 can also be applied to the EMI shields in the arrangement of FIG. 1 or 3. The layer 503 and through via 500 are examples of electrically conductive structures that extend from one mounting surface (for mounting components such as electronic devices) of a circuit board to another mounting surface of the circuit board.

As further shown in FIG. 6, the EMI shield 422 is similarly electrically connected by an EMI gasket 452, electrically conductive structures (500, 502, 506), and an EMI gasket 454 to the EMI shield 438. Similarly, the EMI shield 438 is electrically connected by an EMI gasket 456, electrically conductive structures (500, 502, 506), and an EMI gasket 458 to the EMI shield 442.

The combination of the EMI shields 400, 422, 438, 442, gaskets 448, 450, 452, 454, 456, and 458, and respective sets of electrically conductive structures 500, 502, 504, form a complete enclosure (EMI container) to provide EMI protection. In this manner, multiple EMI-protected chambers are provided to contain electronic devices, and to protect components in the chambers from external EMI. As depicted in FIG. 6, each of the EMI shields has side walls provided at the perimeter of the circuit boards to provide larger surface areas on the circuit boards for mounting electronic devices.

In the example of FIG. 6, the circuit board 416 has a portion 416A that extends further out than the other circuit boards 410 and 432. The circuit board portion 416A is not enclosed by any EMI shield. One or more electronic devices 446 are mounted on the surface 444 of the circuit board portion 416A. The electronic device(s) 446 may be either a low frequency device, or some other component that does not produce high EM emissions.

Although the circuit board portion 416A protrudes outside the EMI container, the use of the through vias 500 to electrically connect successive shields 422 and 438 enables containment of EM emissions.

Figure 8:
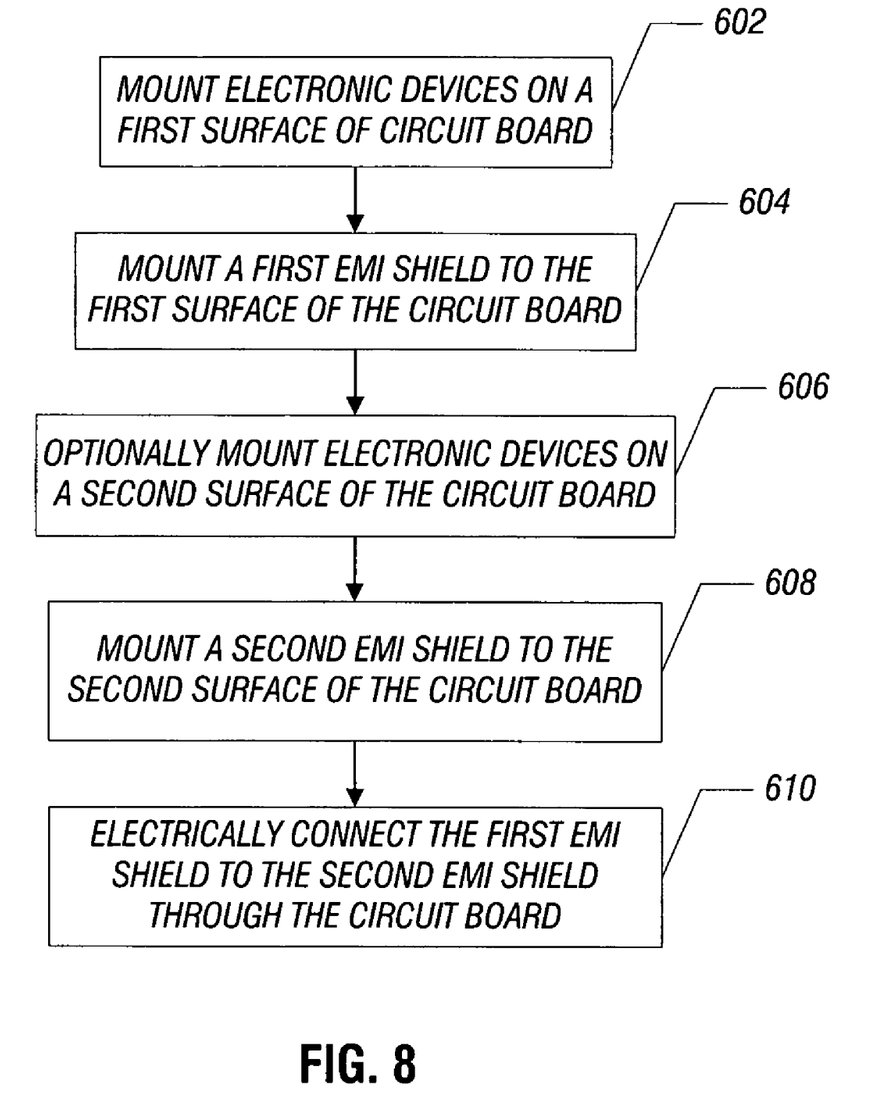
FIG. 8 is a flow diagram of a process according to some embodiments.

FIG. 8 illustrates a process according to some embodiments that involves any one of the assemblies described above. Electronic devices are mounted (at 602) on a first surface of a circuit board. A first EMI shield is then removably mounted (at 604) to the first surface of the circuit board to cover the electronic devices on the first surface. Optionally, electronic devices can be mounted (at 606) to a second surface of the circuit board. A second EMI shield is then mounted (at 608) to the second surface of the circuit board to cover the electronic devices on the second surface. The second EMI shield can be the EMI shield 254 of FIG. 3, or any of the EMI shields 422, 438, or 442 of FIG. 6. In an alternative flow, all electronic components can first be mounted to the circuit boards, followed by mounting the EMI shields.

However, if electronic devices are not mounted to the second surface of the circuit board, then another type of electrically conductive member (such as the plate 110 of FIG. 2) can be mounted to the second surface of the circuit board (or the plate can be integrally formed as part of the circuit board). The first EMI shield is electrically connected (at 610) to either the second EMI shield or the electrically conductive member through the circuit board.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system comprising:
   a circuit board;
   electronic devices mounted on a first surface of the circuit board;
   an electromagnetic interference (EMI) shield removably mounted to the first surface of the circuit board, the EMI shield defining a chamber to contain the electronic devices;
   an electrically conductive member mounted to a second surface of the circuit board; and
   at least an electrically conductive structure extending from the first surface to the second surface of the circuit board to electrically connect the EMI shield to the electrically conductive member.

2. The system of claim 1, wherein the electrically conductive structure comprises a through via extending through the circuit board.

3. The system of claim 2, further comprising additional through vias extending through the circuit board to connect the EMI shield to the electrically conductive member.

4. The system of claim 1, wherein the electrically conductive structure comprises a layer formed on surfaces of the circuit board, the layer extending from the first surface to the second surface.

5. The system of claim 1, wherein the EMI shield is mounted generally at the perimeter of the circuit board.

6. The system of claim 1, wherein the EMI shield is a rigid EMI shield that is removable from the circuit board as a unit.

7. The system of claim 6, wherein the EMI shield comprises a metal cage defining the chamber to contain the electronic devices,
   the system further comprising an airflow generator to generate airflow in the chamber.

8. The system of claim 1, wherein the chamber allows flow of air to cool the electronic devices.

9. The system of claim 1, wherein the electrically conductive member comprise an electrically conductive plate that covers the second surface of the circuit board.

10. The system of claim 1, further comprising at least another electronic device mounted on the second surface of the circuit board, wherein the electrically conductive member comprises another EMI shield defining a chamber to contain the at least another electronic device, the another EMI shield mounted to the second surface of the circuit board.

11. The system of claim 1, further comprising other electronic devices mounted on the second surface of the circuit board, wherein the electrically conductive member comprises another EMI shield defining a chamber to contain the other electronic devices, the another EMI shield mounted to the second surface of the circuit board.

12. The system of claim 1, wherein the circuit board comprises a first circuit board, the EMI shield comprises a first EMI shield, and the electrically conductive member comprises a second EMI shield, the system further comprising a second circuit board, the second EMI shield mounted to the second surface of the first circuit board and to a first surface of the second circuit board such that the first circuit board, second EMI shield, and second circuit board define a second chamber.

13. The system of claim 12, further comprising additional electronic devices mounted to at least one of the second surface of the first circuit board and first surface of the second circuit board, the additional electronic devices contained within the second chamber.

14. The system of claim 13, further comprising a third circuit board, a third EMI shield mounted between a second surface of the second circuit board and a first surface of the third circuit board, and a fourth EMI shield mounted to a second surface of the third circuit board.

15. The system of claim 14, wherein the second circuit board, third EMI shield, and third circuit board define a third chamber, and wherein the third circuit board and fourth EMI shield define a fourth chamber, the system further comprising additional electronic devices contained in the third and fourth chambers.

16. A method comprising:
mounting electronic devices on a first surface of a circuit board;
removably mounting an electromagnetic interference (EMI) shield to the first surface of the circuit board, the EMI shield defining a chamber to contain the electronic devices;
mounting an electrically conductive member to a second surface of the circuit board; and
electrically connecting the EMI shield to the electrically conductive member through the circuit board.

17. The method of claim 16, wherein mounting the EMI shield to the first surface of the circuit board comprises mounting the EMI shield generally at a perimeter of the circuit board.

18. The method of claim 16, wherein electrically connecting the EMI shield to the electrically conductive member is performed using a via through the circuit board.

19. The method of claim 16, further comprising removing the EMI shield as a unit from the first surface of the circuit board.

20. The method of claim 19, further comprising re-mounting the removed EMI shield onto the first surface of the circuit board.

21. The method of claim 16, further comprising generating air flow inside the chamber to cool the electronic devices.

22. The method of claim 21, wherein generating the air flow comprises using an airflow generator attached to the EMI shield.

23. The method of claim 16, wherein mounting the electrically conductive member to the second surface of the circuit board comprises mounting an electrically conductive plate that covers the second surface of the circuit board.

24. The method of claim 16, further comprising:
mounting at least another electronic device on the second surface of the circuit board, wherein the electrically conductive member comprises another EMI shield defining a chamber to contain the at least another electronic device.

25. The method of claim 24, wherein the circuit board comprises a first circuit board, the EMI shield comprises a first EMI shield, and the electrically conductive member comprises a second EMI shield, the method further comprising:
providing a second circuit board;
mounting the second EMI shield to the second surface of the first circuit board and to a first surface of the second circuit board such that the first circuit board, second EMI shield, and second circuit board define a second chamber.

26. The method of claim 25, further comprising mounting additional electronic devices to at least one of the second surface of the first circuit board and first surface of the second circuit board, the additional electronic devices contained within the second chamber.

27. An apparatus for use with a circuit board having first and second surfaces on which electronic devices are mounted, the apparatus comprising:
a first electromagnetic interference (EMI) shield removably mounted to the first surface of the circuit board, the first EMI shield defining a chamber to contain at least one electronic device mounted on the first surface of the circuit board;
a second EMI shield removably mounted to the second surface of the circuit board, the second EMI shield defining a chamber to contain at least one electronic device mounted on the second surface of the circuit board; and
at least an electrically conductive structure extending from the first surface to the second surface of the circuit board to electrically connect the first and second EMI shields.

28. The apparatus of claim 27, wherein the electrically conductive structure comprises a through via extending through the circuit board.

29. The apparatus of claim 28, further comprising additional through vias extending through the circuit board to connect the EMI shield to the electrically conductive member.

30. The apparatus of claim 27, wherein the electrically conductive structure comprises a layer formed on surfaces of the circuit board, the layer extending from the first surface to the second surface.

31. The apparatus of claim 27, wherein the first EMI shield is mounted generally at the perimeter of the circuit board.

32. The apparatus of claim 27, wherein the chamber defined by the first EMI shield allows flow of air to cool the at least one electronic device mounted to the first surface.

33. An apparatus for use in a system having a circuit board and electronic devices mounted on a first surface of the circuit board, comprising:
means for providing electromagnetic interference (EMI) shielding, the EMI shielding means removably mounted to the first surface of the circuit board, and the EMI shielding means for defining a chamber to contain the electronic devices;
an electrically conductive means for mounting to a second surface of the circuit board; and
means for electrically connecting the EMI shielding means to the electrically conductive means through the circuit board.

34. The apparatus of claim 33, wherein the electrically conductive means comprises second means for providing EMI shielding, the second EMI shielding means defining another chamber for containing electronic devices mounted on the second surface of the circuit board.

35. The apparatus of claim 33, further comprising means for generating airflow in the chamber defined by the first EMI shielding means.

* * * * *

UNITED STATES PATENT AND TRADEMARK OFFICE
CERTIFICATE OF CORRECTION

PATENT NO.        : 6,958,445 B1                                                      Page 1 of 1
APPLICATION NO.   : 11/014292
DATED             : October 25, 2005
INVENTOR(S)       : Brent A. Boudreaux et al.

It is certified that error appears in the above-identified patent and that said Letters Patent is hereby corrected as shown below:

On the Title page, in Item (57), in column 2, under "Abstract", line 1, delete "composes" and insert -- includes --, therefor.

Signed and Sealed this

Twenty-first Day of July, 2009

JOHN DOLL
*Acting Director of the United States Patent and Trademark Office*